United States Patent
Huang et al.

(10) Patent No.: US 8,934,093 B2
(45) Date of Patent: Jan. 13, 2015

(54) CRYSTAL FIBER, RAMAN SPECTROMETER USING THE SAME AND DETECTION METHOD THEREOF

(75) Inventors: Pi Ling Huang, Taipei (TW); Kuang-Yu Hsu, Taipei (TW); Cheng-Kai Wang, Taipei (TW); Edmund Sun, Taipei (TW); Sheng-Lung Huang, Taipei (TW)

(73) Assignee: National Taiwan University, Taipei (TW)

( * ) Notice: Subject to any disclaimer, the term of this patent is extended or adjusted under 35 U.S.C. 154(b) by 205 days.

(21) Appl. No.: 13/401,199

(22) Filed: Feb. 21, 2012

(65) Prior Publication Data

US 2012/0212736 A1 Aug. 23, 2012

(30) Foreign Application Priority Data

Feb. 23, 2011 (TW) .............. 100105934 A

(51) Int. Cl.
G01J 3/44 (2006.01)
G01J 3/02 (2006.01)
G01J 3/10 (2006.01)
H01S 3/067 (2006.01)
H01S 3/0941 (2006.01)
H01S 3/16 (2006.01)
H01S 5/323 (2006.01)

(52) U.S. Cl.
CPC ............. G01J 3/0218 (2013.01); G01J 3/44 (2013.01); G01J 3/0245 (2013.01); G01J 3/10 (2013.01); H01S 3/06716 (2013.01); H01S 3/09415 (2013.01); H01S 3/1623 (2013.01); H01S 5/32341 (2013.01); H01S 3/1625 (2013.01); H01S 3/1636 (2013.01)

USPC ......................................... 356/301

(58) Field of Classification Search
USPC ............................. 356/301, 72–73
See application file for complete search history.

(56) References Cited

U.S. PATENT DOCUMENTS

| | | | |
|---|---|---|---|
| 4,890,915 A * | 1/1990 | Byvik et al. .................. 356/73 |
| 6,151,522 A | 11/2000 | Alfano et al. | |
| 6,154,310 A | 11/2000 | Galvanauskas et al. | |
| 6,373,565 B1 | 4/2002 | Kafka et al. | |
| 6,389,198 B2 | 5/2002 | Kafka et al. | |
| 6,560,478 B1 | 5/2003 | Alfano et al. | |
| 6,603,791 B2 | 8/2003 | Goldberg et al. | |
| 7,095,931 B2 | 8/2006 | Sezerman et al. | |
| 7,403,689 B2 | 7/2008 | Koch, III et al. | |
| 8,249,408 B2 * | 8/2012 | Coleman ....................... 385/129 |

FOREIGN PATENT DOCUMENTS

WO   WO 01/69734 A1   9/2001
WO   WO 02/091530 A1   11/2002

* cited by examiner

*Primary Examiner* — Abdullahi Nur
(74) *Attorney, Agent, or Firm* — Rosenberg, Klein & Lee

(57) ABSTRACT

The invention relates to a crystal fiber, a Raman spectrometer using the same and a inspection method thereof. The crystal fiber comprises a sapphire crystal is doped with two transition metals having different concentrations. An excitation light beam at a specific wavelength can propagate along the crystal fiber to generate a narrow-band light beam and a wide-band light beam to project on a specimen. Raman scattered light is emitted from the specimen. The wavelength of the Raman scattered light falls within the wavelength range of the wide-band light beam so that the wide-band light beam is enhanced at some characteristic wavelengths to facilitate Raman spectroscopy.

19 Claims, 6 Drawing Sheets

CRYSTAL FIBER, RAMAN SPECTROMETER USING THE SAME AND DETECTION METHOD THEREOF

BACKGROUND OF THE INVENTION

1. Technical Field

The present invention generally relates to a crystal fiber and, more particularly, to a sapphire crystal fiber doped with two transition metals having different concentrations so as to generate a wide-band light beam and a narrow-hand light beam for use in a Raman spectrometer.

2. Description of the Prior Art

Raman effect refers to inelastic scattering of a photon interacting with substances. Raman spectroscopy reveals the shift in the scattered photon frequency away from the incident photon frequency, also known as Raman shift, which has been widely used in detections and analyses in chemistry, biotechnology and medical science because molecular identification can be achieved according to vibrational spectroscopic information of chemical bonds and symmetry of molecules.

Generally, only one in every $10^6$ to $10^8$ photons is inelastically scattered, which leads to difficulty in detection of inelastically scattered photons. Therefore, inspection light source with a higher power, for example higher than 150 mW, is preferably adopted to project on the specimen in order to make detection less difficult. However, the inspection light with such a high power may induce undesirable damages to human bodies or other biological samples when Raman spectroscopy is applied. In addition, such condition may violate related medical laws and regulations.

To facilitate Raman spectroscopy, the power of inelastically scattered photons can be enhanced by determining the wavelength of the inspection light so that the wavelength falls within an absorption band of the specimen. However, to detect a wide variety of specimens, devices for generating inspection light are required to be capable of wavelength tuning during Raman spectroscopy measurement. In most cases, Raman spectroscopy requires that the detection light projects on the specimen for a long time, which results in low throughput as well as possible damages to the specimen. Moreover, the devices for generating inspection light may enlarge the size and add manufacturing cost to the Raman spectrometer when it provides wavelength tuning.

SUMMARY OF THE PRESENT INVENTION

It is one object of the present invention to provide a crystal fiber doped with two transition metals having different concentrations. An excitation light beam is able to pass through the crystal fiber to generate a wide-band light beam and a narrow-band light beam.

It is another object of the present invention to provide a crystal fiber made of a sapphire crystal doped with chromium (Cr) and titanium (Ti), wherein the concentration of chromium ions is higher than the concentration of titanium ions. The excitation light beam excites the chromium ions to generate a narrow-band light beam and the titanium ions to generate a wide-band light beam.

It is still another object of the present invention to provide a crystal fiber, wherein the crystal fiber is cylindrical and is coated with a multi-layered film at both ends so as to enhance the intensity of the narrow-band light beam and the wide-hand light beam.

It is still another object of the present invention to provide a Raman spectrometer, wherein an excitation light beam generated by a light-emitting unit passes through a crystal fiber to generate a narrow-band light beam and a wide-band light beam. The narrow-band light beam and the wide-band light beam project on the specimen, and a detection unit is able to receive Raman scattered light from the specimen.

It is still another object of the present invention to provide a Raman spectrometer, wherein a narrow-band light beam and a wide-band light beam project on a specimen so that the Raman scattered light is emitted from the specimen. The wavelength of the Raman scattered light falls within the wavelength range of the wide-band light beam so that the wide-band light beam is enhanced at certain wavelengths to facilitate Raman spectroscopy measurement.

It is still another object of the present invention to provide a detection method, wherein a narrow-hand light beam and a wide-band light beam project on a specimen. Thereafter, the Raman scattered light at a second wavelength is emitted from the specimen that is illuminated by the narrow-band light beam at a first wavelength to enhance the intensity and/or the spectral density at the second wavelength within the wide-band light beam to facilitate Raman spectroscopy measurement.

It is still another object of the present invention to provide a detection method, wherein a narrow-band light beam and a wide-band light beam illuminate on a specimen so that the Raman scattered light is emitted from the specimen. The wavelength of the Raman scattered light falls within the wavelength range of the wide-hand light beam so that the wide-band light beam is enhanced at certain wavelengths.

To achieve these and other objects of the present invention, a crystal fiber is provided, comprising a sapphire crystal, a first transition metal and a second transition metal, wherein the concentration of the first transition metal is different from the concentration the second transition metal.

The invention further provides a Raman spectrometer, comprising: a light-emitting unit for generating an excitation light beam; a crystal fiber comprising a sapphire crystal, a first transition metal and a second transition metal, wherein the crystal fiber is capable of receiving the excitation light beam and generating a narrow-band light beam and a wide-band light beam to project on a specimen; and a detection unit for receiving Raman scattered light from the specimen.

The invention further provides a detection method, comprising steps of: projecting a inspection light beam on a specimen, wherein the inspection light beam comprises a narrow-band light beam and a wide-band light beam; emitting a Raman scattered light from the specimen, wherein the wavelength of the Raman scattered light falls within the wavelength range of the wide-band light beam so that the wide-band light beam is enhanced at certain wavelengths; and detecting the Raman scattered light at the wavelengths where the wide-band light beam is enhanced.

BRIEF DESCRIPTION OF THE DRAWINGS

The objects and spirits of the embodiments of the present invention will be readily understood by the accompanying drawings and detailed descriptions, wherein.

DETAILED DESCRIPTION OF THE PREFERRED EMBODIMENTS

The present invention may be exemplified but not limited by various embodiments as described hereinafter. In the context of this patent, the term "coupled" means either a direct connection or an indirect connection (e.g. one or more intervening connections) between one or more objects or components.

Figure 1:
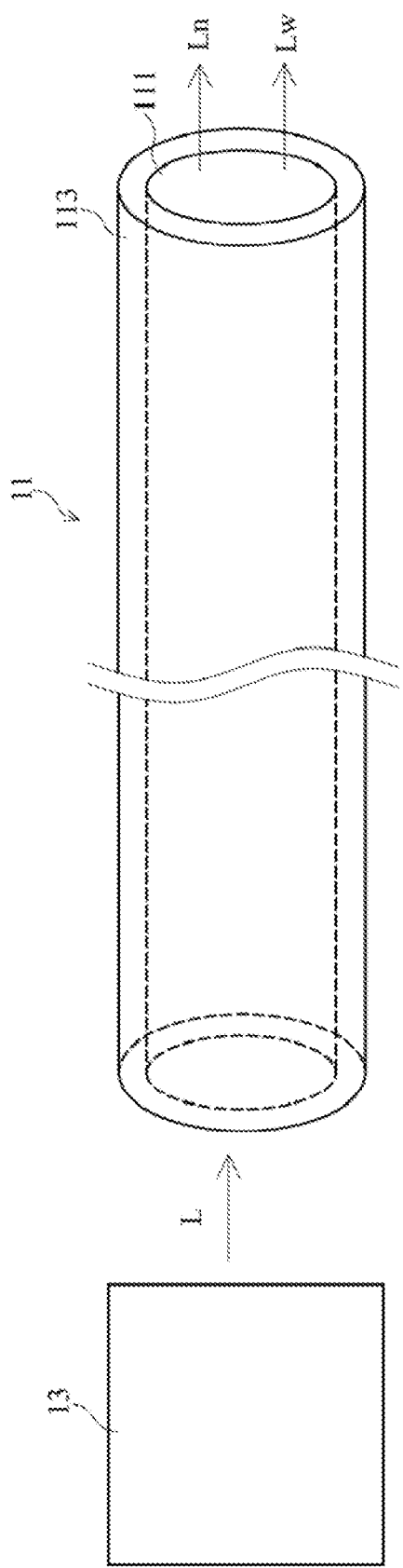
FIG. 1 is a perspective diagram of a crystal fiber according to one embodiment of the present invention.
Figure 2:
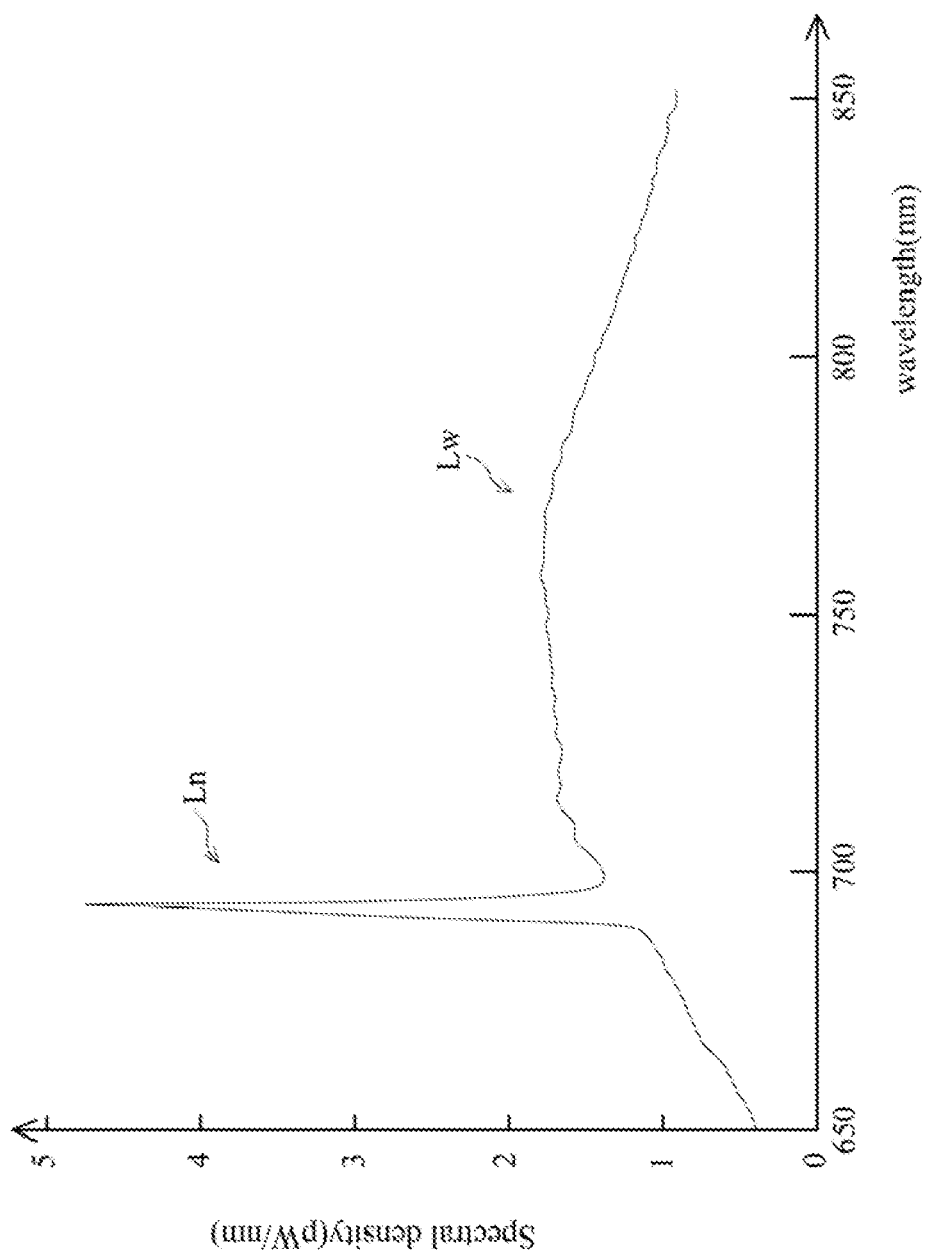
FIG. 2 shows the wavelength dependency of spectral density when an excitation light beam passes through a crystal fiber according to one embodiment of the present invention.

Please refer to FIG. 1 and FIG. 2 for a perspective diagram of a crystal fiber and the wavelength dependency of spectral density when an excitation light beam passes through the crystal fiber according to one embodiment of the present invention, respectively. The crystal fiber may be cylindrical and comprise a sapphire crystal, a first transition metal and a second transition metal. The first transition metal and the second transition metal have different concentrations.

In one embodiment of the present invention, the crystal fiber 11 is cylindrical and comprises a core 111 and a cladding 113. The cladding 113 is disposed enclosing part of the outer surface of the core 111. The core 111 comprises a sapphire crystal, a first transition metal and a second transition metal, while the cladding 113 is made of borosilicate glass. In one preferred embodiment of the present invention, the first transition metal is chromium (Cr), while the second transition metal is titanium (Ti). The concentration of the first transition metal (Cr) ions is higher than that of the second transition metal (Ti) ions. For example, the concentration of chromium ions ranges from 0.1 to 0.01 wt %, while the concentration of titanium ions ranges from 1 to 0.1 wt %.

During operation, a light-emitting unit 13 emits an excitation light beam L into the crystal fiber 11. The excitation light beam L passes through the crystal fiber 11. Part of the excitation light beam L propagating along the crystal fiber 11 may excite the first transition metal ions, such as chromium ions, in the crystal fiber 11 to generate a narrow-band light beam Ln. Part of the excitation light beam L passing through the crystal fiber 11 may excite the second transition metal ions, such as titanium ions, in the crystal fiber 11 to generate a wide-band light beam Lw.

In one embodiment of the present invention, a nitride-based semiconductor laser device may be used as the light-emitting unit 13 so that the wavelength of the excitation light beam L ranges from 400 to 550 nm. It is apparent that a solid-state laser device may also be used as the light-emitting unit 13 in other embodiments. The profiles of the narrow-band light beam Ln and the wide-band light beam Lw are as shown in FIG. 2. The profile of the wavelength of the narrow-band light beam Ln is narrower than that of the wide-band light beam Lw. For example, the wavelength of the narrow-band light beam Ln ranges from 650 to 750 nm, while the energy shift of wide-band light beam Lw from the narrow-hand light beam Ln ranges from 500 to 3000 cm$^{-1}$. Moreover, the intensity or spectral density, of the narrow-band light beam Ln is higher than that of the wide-band light beam Lw. For example, the peak spectral density of the narrow-band light beam Ln reaches 4.5 to 5 pW/nm, while the spectral density of the wide-band light beam is lower than 2 pW/nm.

FIG. 2 illustrates wavelength dependency of spectral density of a narrow-band light beam Ln and a wide-band light beam Lw according to one embodiment of the present invention. There are alternative ways to change the spectral density profiles of the narrow-band light beam Ln and the wide-band light beam Lw. For example, in other embodiments, light at different wavelengths may also be used as the excitation light beam. Moreover, the sapphire crystal may be doped with other transition metals having different concentrations. Moreover, the length of the crystal fiber 11 may be changed.

Figure 1A:
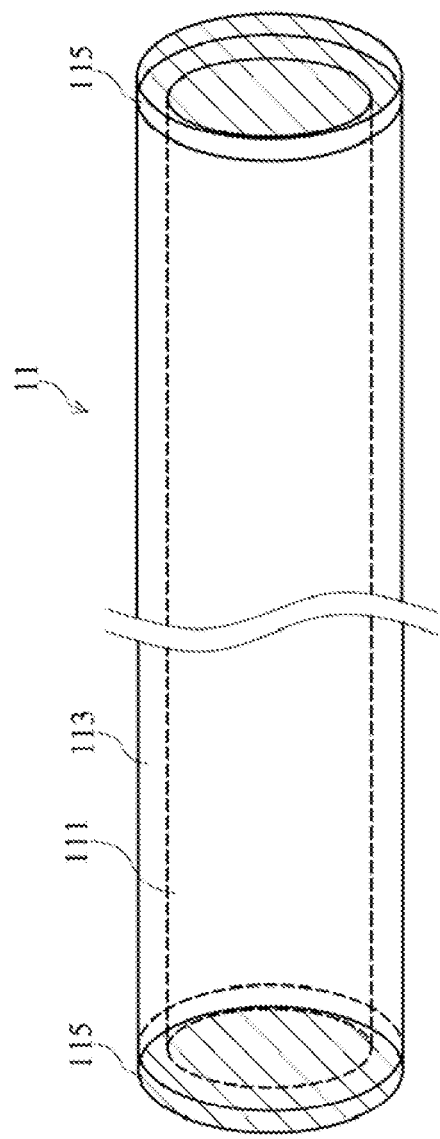
FIG. 1A is a perspective diagram of a crystal fiber according to another embodiment of the present invention.

Alternatively, to increase the spectral density of the narrow-band light beam Ln and the wide-band light beam Lw generated by the crystal fiber 11. The crystal fiber 11 may also be coated with a multi-layered film 115 at both ends. For example, the multi-layered film 115 may be disposed on the core 111 and/or the cladding 113 to form a laser cavity so that part of the light may be reflected by the multi-layered film(s) 115 and thus repeatedly propagate along the crystal fiber 11 to excite the first transition metal and the second transition metal in the crystal fiber 11, as shown in FIG. 1A.

Figure 3:
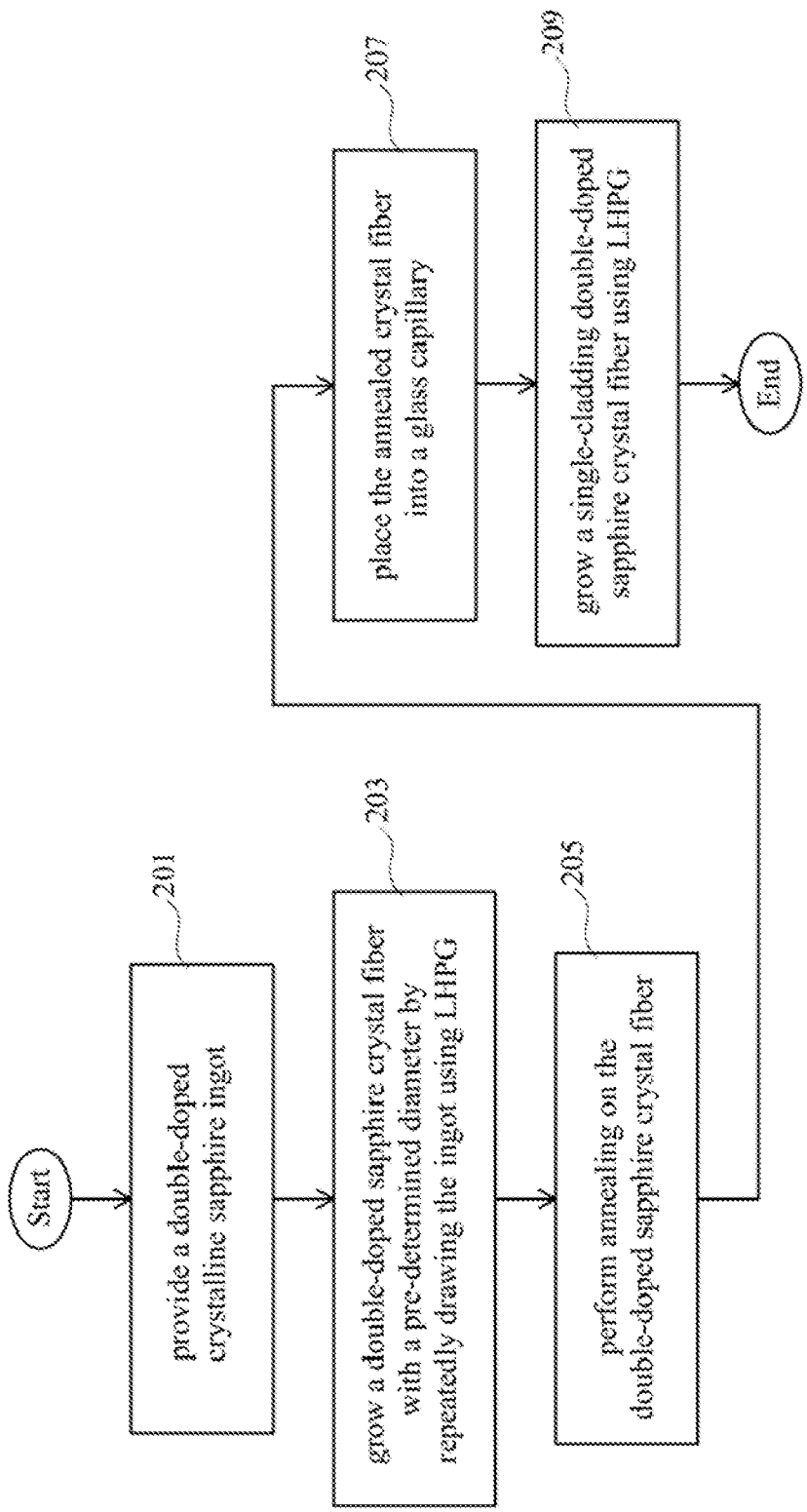
FIG. 3 is a flowchart of a method for manufacturing a crystal fiber according to one embodiment of the present invention.

Please refer to FIG. 3, which is a flowchart of a method for manufacturing a crystal fiber according to one embodiment of the present invention. In FIG. 3, the method for manufacturing a crystal fiber comprises steps as described herein. First, a double-doped crystalline sapphire rod is provided, for example, doped with a first transition metal (Cr) and a second transition metal (Ti), as in Step 201. The crystal rod is repeatedly drawn using laser-heated pedestal growth (LHPG) method to grow a double-doped sapphire crystal fiber with a pre-determined diameter, for example, 10 to 50 μm, as in Step 203.

Annealing is performed on the double-doped sapphire crystal fiber with a pre-determined diameter using a furnace or by laser heating, as in Step 205. Afterwards, the annealed double-doped sapphire crystal fiber is inserted into a glass capillary having a suitable size (for example, 50 to 100 μm for the inner diameter and 80 to 170 μm for the outer diameter), as in Step 207.

At last, a single-cladding double-doped sapphire crystal fiber is grown from the double-doped sapphire crystal fiber using LHPG, as in Step 209. The sapphire crystal fiber is crystal fiber 11 in FIG. 1. The glass capillary may comprise an optical glass material with a softening temperature lower than 1000° C., such as borosilicate glass capillary.

Figure 4:
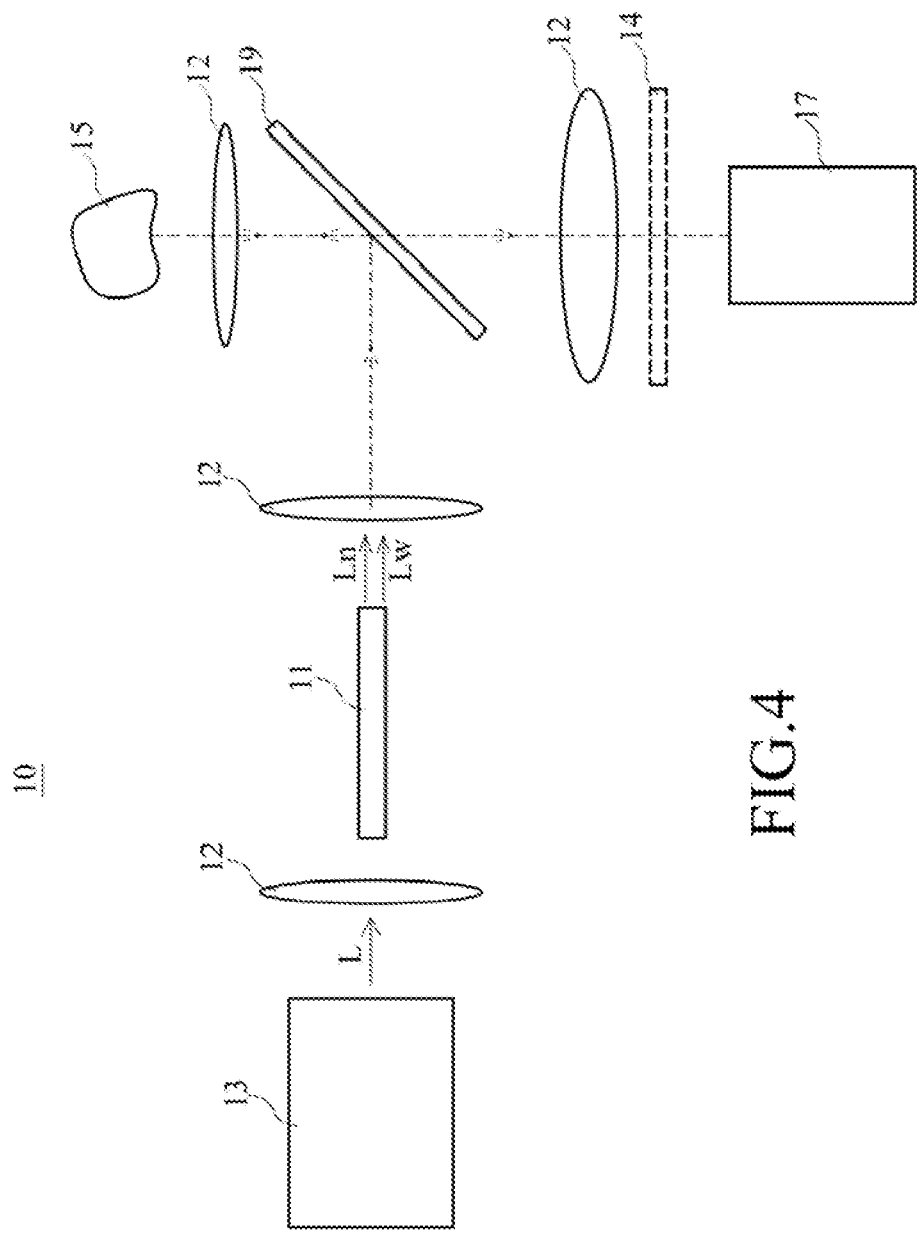
FIG. 4 is a schematic diagram of a Raman spectrometer according to one embodiment of the present invention.
Figure 5:
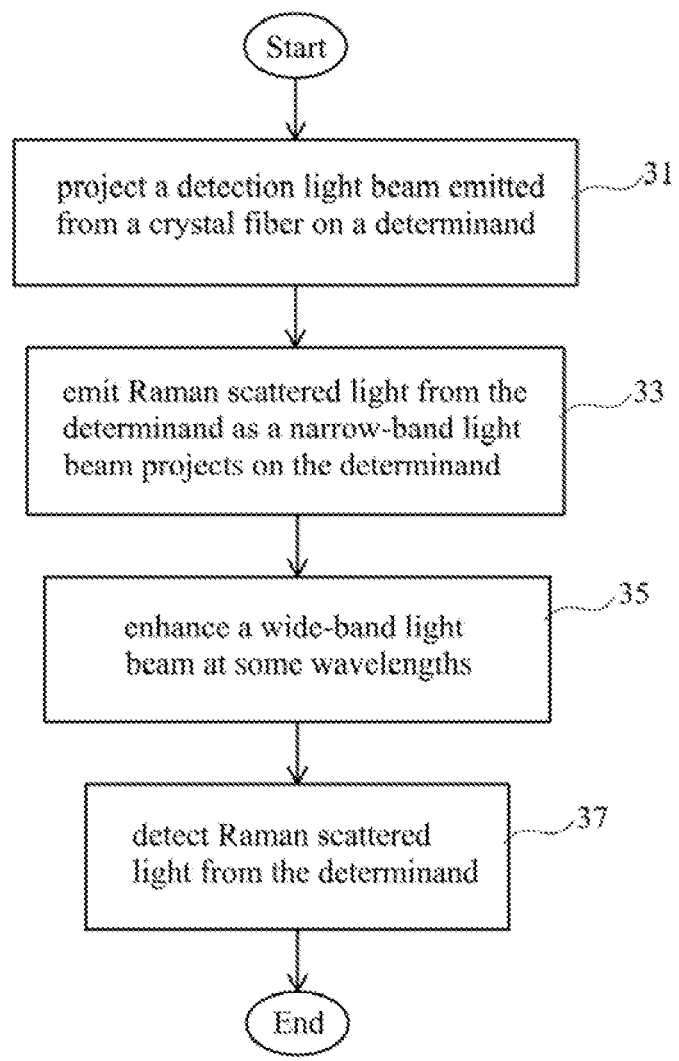
FIG. 5 is a flowchart of a detection method according to one embodiment of the present invention.

Please refer to FIG. 4 and FIG. 5 for a schematic diagram of a Raman spectrometer and a flowchart of a inspection method according to one embodiment of the present invention. In FIG. 4 and FIG. 5, the Raman spectrometer 10 comprises a light-emitting unit 13, a crystal fiber 11 and a detection unit 17. The crystal fiber 11 is a double-doped sapphire crystal fiber and comprises a first transition metal, a second transition metal and a sapphire crystal. The first transition metal and the second transition metal have different concentrations. Alternatively, the crystal fiber 11 may also be coated with a multi-layered film 115 at both ends, as shown in FIG. 1A.

The light-emitting unit 13 is capable of emitting an excitation light beam L, which is received by the crystal fiber 11 so that the excitation light beam L propagated along the crystal fiber 11. Part of the excitation light beam L propagating along the crystal fiber 11 may excite the first transition metal ions, such as chromium ions, in the crystal fiber 11 to generate a narrow-band light beam Ln. Part of the excitation light beam L propagating along the crystal fiber 11 may excite the second transition metal ions, such as titanium ions, in the crystal fiber 11 to generate a wide-band light beam Lw. The detection unit 17 is capable of receiving Raman scattered light from the specimen 15 after the narrow-band light beam Ln and the wide-band light beam Lw project on the specimen 15.

In FIG. 5, the inspection method comprises steps as described herein. First, a inspection light beam emitted from the crystal fiber 11 is projected on a specimen 15, as described in Step 31. The inspection light beam comprises a narrow-hand light beam Ln and a wide-band light beam Lw. In other words, the narrow-band light beam Ln and the wide-band light beam Lw project on the specimen 15 at the same time. The profile of the output spectrum of the narrow-band light beam Ln is narrower than that of the wide-band light beam Lw. For example, the wavelength of the narrow-band light beam Ln is λ1. Part of the narrow-band light beam Ln projecting on the specimen 15 causes inelastic scattering so that the specimen 15 emits Raman scattered light having a wavelength different from the wavelength of the narrow-band light beam Ln, as described in Step 33. For example, the wavelength of the Raman scattered light may comprise a second wavelength λ2.

Practically, the specimen 15 may emit Raman scattered light with various wavelengths because of the different chemical bonds or molecular structures since the specimen 15 may comprise different materials. In other words, the Raman scattered light from the specimen 15 may comprise a plurality of wavelengths rather than a single second wavelength λ2.

The wide-band light beam Lw of the inspection light beam projects on the specimen 15 at the same time. The profile of the wavelength of the wide-band light beam Lw is much wider than that of the narrow-band light beam Ln. For example, the energy shift of wide-band light beam Lw from the narrow-hand light beam Ln ranges from 500 cm$^{-1}$ to 3000 cm$^{-1}$. Moreover, the wavelength of the Raman scattered light from the specimen 15 falls within the wavelength range of the wide-hand light beam Lw so that the spectral densities of the wide-band light beam Lw at specific wavelengths are enhanced, as described in Step 35.

In one embodiment of the present invention, the wavelength of the narrow-band light beam Ln is the first wavelength λ1, the wavelength of Raman scattered light comprises the second wavelength λ2, and the wavelength of the wide-hand light beam Lw covers the second wavelength λ2. When the narrow-band light beam Ln illuminates on the specimen 15, the specimen 15 emits at least Raman scattered light at the second wavelength λ2 due to the Raman effect. Moreover, for the wavelength of the wide-band light beam Lw equal to the wavelength of the Raman scattered light, the spectral density at such wavelength will be amplified by 10 to 10$^4$ times. In the present embodiment, the wavelength of the Raman scattered light from the specimen 15 is the second wavelength λ2. The spectral density of the wide-hand light beam Lw at the second wavelength λ2 is amplified by 10 to 10$^4$ times. Since the spectral density of the wide-band light beam Lw at the second wavelength λ2 is enhanced, the detection of Raman scattered light is facilitated.

In another embodiment of the present invention, the specimen 15 emits scattered light not only at the second wavelength λ2 but also at other wavelengths when the narrow-band light beam Ln projects on the specimen 15. In other words, the spectrum of the Raman scattered light from the specimen 15 comprises a plurality of characteristic wavelengths. These characteristic wavelengths include the second wavelength λ2 and other wavelengths. The spectral density of the wide-band light beam Lw at each of the characteristic wavelengths can be enhanced to facilitate the authentication of the specimen. For example, the spectral densities of the wide-band light beam Lw at specific wavelengths are enhanced for those equal to the plurality of characteristic wavelengths. Moreover, the material of the specimen 15 is identified according to the multiple characteristic wavelengths. In certain embodiment, the specimen may be bio-sample, such as blood, and the Raman spectrometer 10 is able to identify blood sugar, cholesterol or carotene of the blood.

The composition of the specimen 15 may be authenticated by using the detection unit 17 to indentify the peak wavelengths of the Raman scattered light from the specimen 15, as described in Step 37. Moreover, the Raman spectrometer 10 of the present invention can operate by only the use of the detection unit 17, and without using any lock-in amplifier to detect the scattered light from the specimen 15 which reduces the size of the Raman spectrometer as well as the manufacturing cost thereof.

Raman scattered light from the specimen 15 may have more than one peak wavelength. However, the spectral density of the Raman scattered light at various wavelengths is enhanced since the wavelength profile of wide-band light beam Lw of the present invention is wide enough and covers all the peak wavelengths of the Raman scattered light from the specimen 15. Accordingly, the detection unit 17 is capable of detecting Raman scattered light at various wavelengths at the same time, which effectively shortens the detection time and prevents damages to human bodies or biological samples due to long-time illumination of the inspection light beam. In one embodiment of the present invention, the specimen 15 may be bio-sample, such as blood, and the Raman spectrometer 10 is able to identify blood sugar, cholesterol or carotene of the blood.

Practically, the Raman spectrometer 10 may comprise a beam splitter 19 and a plurality of lenses 12 or a lens set. For example, the lenses 12 may be disposed at both ends of the crystal fiber 11, and/or in front of the specimen 15, and/or in front of the detection unit 17 so as to collect light. The beam splitter 19 is capable of reflecting the narrow-hand light beam Ln and the wide-band light beam Lw from the crystal fiber 11 so that the narrow-band light beam Ln and the wide-band light beam Lw project on the specimen 15. Scattered light from the specimen 15 passes through the beam splitter 19 to project on the detection unit 17.

Moreover, to facilitate detection by the detection unit 17, a filter 14 may be disposed in front of the detection unit 17, or between the detection unit 17 and the lenses 12 as an example, to filter out the narrow-band light beam Ln and prevent oversaturation in the detection unit 17.

It is to be understood the invention is not limited to particular systems described which may, of course, vary. It is also to be understood that the terminology used herein is for the purpose of describing particular embodiments only, and is not intended to be limiting. As used in this specification, the singular forms "a", "an" and "the" include plural referents unless the content clearly indicates otherwise. Thus, for example, reference to "a device" includes a combination of two or more devices and reference to "a material" includes mixtures of materials.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A crystal fiber, comprising: a sapphire crystal having a core, the core comprising a first transition metal and a second transition metal, wherein the concentration of said first transition metal is different from the concentration of said second transition metal, whereby said first and said second transition metals generate a narrow-band light beam and a wide-band light beam simultaneously when an excitation light passes through said crystal fiber.

2. The crystal fiber as recited in claim 1, wherein said first transition metal is chromium (Cr) and said second transition metal is titanium (Ti).

3. The crystal fiber as recited in claim 2, wherein the concentration of said first transition metal is higher than the concentration of said second transition metal.

4. The crystal fiber as recited in claim 1, further comprising a light-emitting unit for providing said excitation light beam that generates said narrow-band light beam and said wide-band light beam when simultaneously passing through said crystal-fiber.

5. The crystal fiber as recited in claim 4, wherein said excitation light beam excites said first transition metal to generate said narrow-band light beam, and said excitation light beam excites said second transition metal to generate said wide-band light beam.

6. The crystal fiber as recited in claim 5, wherein the energy shift of said wide-band light beam from said narrow-band light beam ranges from 500 cm.sup.-1 to 3000 cm.sup.-1.

7. The crystal fiber as recited in claim 1, further comprising a cladding, wherein said cladding is disposed enclosing part of the outer surface of said core.

8. The crystal fiber as recited in claim 7, wherein said cladding is made of borosilicate glass or aluminosilicate glass.

9. The crystal fiber as recited in claim 7, wherein said core is cylindrical and is coated with a multi-layered film at both ends.

10. A Raman spectrometer, comprising: a light-emitting unit for generating an excitation light beam; a crystal fiber comprising a sapphire crystal having a core, the core comprising a first transition metal and a second transition metal, the first transition metal and the second transition metal having different concentrations, wherein said excitation light beam passes through said crystal fiber to generate a narrow-band light beam and a wide-band light beam simultaneously to project on a specimen; and a detection unit for receiving Raman scattered light from said specimen.

11. The Raman spectrometer as recited in claim 10, wherein said first transition metal is chromium (Cr) and said second transition metal is titanium (Ti), and the concentration of said first transition metal is higher than the concentration of said second transition metal.

12. The Raman spectrometer as recited in claim 10, wherein said crystal fiber is cylindrical, and is coated with a multi-layered film at both ends.

13. The Raman spectrometer as recited in claim 10, wherein the peak wavelengths of the Raman scattered light fall within the wavelength range of the wide-band light beam.

14. The Raman spectrometer as recited in claim 10, wherein said detection unit is disposed facing a filter to filter out said narrow-band light beam.

15. An inspection method, comprising the steps of:
(a) projecting an inspection light beam on a specimen, wherein said inspection light beam comprises a narrow-band light beam and a wide-band light beam;
(b) emitting a Raman scattered light from said specimen, wherein the wavelength of said Raman scattered light falls within the wavelength range of said wide-band light beam so that said wide-band light beam is enhanced at specific wavelength; and
(c) detecting said Raman scattered light at the wavelength where said wide-band light beam is enhanced.

16. The inspection method as recited in claim 15, wherein the spectrum of said Raman scattered light comprises a plurality of characteristic wavelengths after said narrow-band light beam projects on said specimen, and said wide-hand light beam is enhanced when the wavelength of said wide-band light beam is equal to anyone of said plurality of characteristic wavelengths.

17. The inspection method as recited in claim 16, wherein the composition of said specimen is identified according to said characteristic wavelengths.

18. The inspection method as recited in claim 15, further comprising a step of: filtering out said narrow-band light beam before detecting said Raman scattered light.

19. The inspection method as recited in claim 15, further comprising a step of: identifying blood sugar, cholesterol or carotene of said specimen.

* * * * *